United States Patent [19]

Baarman et al.

[11] Patent Number: 5,006,849

[45] Date of Patent: Apr. 9, 1991

[54] APPARATUS AND METHOD FOR EFFECTING DATA COMPRESSION

[75] Inventors: David W. Baarman, Zeeland, Mich.; David M. Richards, Littleton, Colo.

[73] Assignee: Astro, Inc., Grand Rapids, Mich.

[21] Appl. No.: 385,859

[22] Filed: Jul. 26, 1989 (Under 37 CFR 1.47)

[51] Int. Cl.⁵ .............................................. H03M 7/30
[52] U.S. Cl. ........................................ 341/95; 341/106
[58] Field of Search ........................... 364/419; 381/43; 341/50, 51, 55, 60, 65, 87, 95, 106

[56] References Cited

U.S. PATENT DOCUMENTS

| | | | |
|---|---|---|---|
| 3,393,270 | 7/1968 | Simjian | 341/90 |
| 4,295,124 | 10/1981 | Roybal | 341/86 |
| 4,558,302 | 12/1985 | Welch | 341/51 |
| 4,599,612 | 7/1986 | Kaji et al. | 364/419 |
| 4,624,008 | 11/1986 | Vensko et al. | 381/43 |
| 4,685,060 | 8/1987 | Yamano et al. | 364/419 |
| 4,748,638 | 5/1988 | Friedman et al. | 341/50 |
| 4,782,325 | 11/1988 | Jeppsson et al. | 341/55 |
| 4,791,587 | 12/1988 | Doi | 364/419 |
| 4,811,399 | 3/1989 | Landell et al. | 381/43 |
| 4,843,389 | 6/1989 | Lisle et al. | 341/90 |
| 4,866,445 | 9/1989 | Valero et al. | 341/106 |
| 4,896,357 | 1/1990 | Hatano et al. | 381/43 |

*Primary Examiner*—William M. Shoop, Jr.
*Assistant Examiner*—Howard L. Williams
*Attorney, Agent, or Firm*—Warner, Norcross & Judd

[57] ABSTRACT

A dictionary-based data compression technique wherein compression occurs at a variety of levels in response to word, phrase, super-phrase (sentence), and context-sensitive recognition. A separate dictionary is used at each compression level so that word compression occurs first, followed by phrase compression, followed by other compressions. Disclosed applications built upon the compression strategy include an idiomatic-language translator and a voice-recognition control system.

26 Claims, 7 Drawing Sheets

FIG. 6 ns of applications. Data compression refers to a data conversion wherein the converted data is represented in fewer bytes than the unconverted data without information loss. Such conversion is possible, for example, because standard codes utilize more bits for letters, words, and phrases than are actually necessary to represent the information therein. Presently, data compression is perhaps of most interest in the fields of communication and storage. In communications, data compression results in lower transmission time and therefore reduced communication cost. In storage devices, compression results in the ability to store more information in a given physical storage area.

APPARATUS AND METHOD FOR EFFECTING DATA COMPRESSION

BACKGROUND OF THE INVENTION

The present invention relates to data compression, and more particularly to dictionary-based data compression.

Data compression is an area of active exploration and development in conjunction with a variety of applications. Data compression refers to a data conversion wherein the converted data is represented in fewer bytes than the unconverted data without information loss. Such conversion is possible, for example, because standard codes utilize more bits for letters, words, and phrases than are actually necessary to represent the information therein. Presently, data compression is perhaps of most interest in the fields of communication and storage. In communications, data compression results in lower transmission time and therefore reduced communication cost. In storage devices, compression results in the ability to store more information in a given physical storage area.

Prior data compression schemes have included techniques for converting textual data to numeric data on a word-by-word basis. Such techniques are illustrated in U.S. Pat. Nos. 4,295,124 issued Oct. 13, 1981 to Roybal and entitled COMMUNICATION METHOD AND SYSTEM; 3,393,270 issued July 16, 1968 to Simjian and entitled COMMUNICATION SYSTEM EMPLOYING CHARACTER COMPARISON AND CODE TRANSLATION; and 4,558,302 issued Dec. 10, 1985 to Welch and entitled HIGH SPEED DATA COMPRESSION AND DECOMPRESSION APPARATUS AND METHOD. Although these techniques produce some data compression, they do not provide the compression rates desired in many segments of the industry.

Another compression technique is frequency-based compression. This technique is adaptive to the character stream and provides compression for the most frequently occurring information. Again, the achieved compression rates are not as high as desired.

Other data compression techniques remove unnecessary bits and/or bytes (e.g. blank spaces) from the data stream. However, these techniques provide relatively little compression in comparison to present industry demands.

SUMMARY OF THE INVENTION

The aforementioned problems are overcome in the present invention which goes beyond traditional notions of word compression to additionally provide phrase, super-phrase, context, and other information compression of input data. The compression schemes are "dictionary-type" with a separate dictionary provided for each level of the compression. For example, a first dictionary is provided for word compression; and a second dictionary is provided for phrase compression. Further, a third dictionary can be provided for super-phrase compression; and fourth and subsequent dictionaries can be provided for context-sensitive or other compressions.

The technique can be implemented primarily in software or primarily in hardware. In the hardware embodiment, a dedicated digital device is provided to provide each conversion within a single clock pulse. Accordingly, the system is capable of operating at unparalleled speeds in comparison with known systems.

The applications of the compression technology are wide and varied in view of the compression rates realized. Applications forming a portion of the present invention include idiomatic language translators and a voice-recognition control system.

These and other objects, advantages, and features of the invention will be more fully understood and appreciated by reference to the detailed description of the preferred embodiment and the drawings.

DETAILED DESCRIPTION OF THE PREFERRED EMBODIMENT

I. Data Compression Technique

A. General Description

Figure 1:
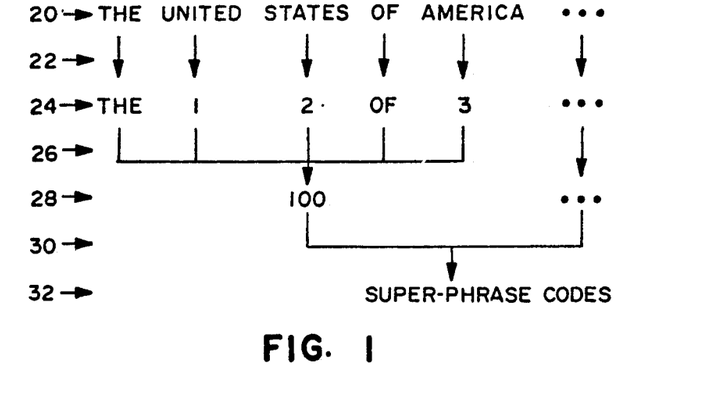
FIG. 1 is a diagram illustrating the compression technique of the present invention.

The data compression technique of the present invention is partially illustrated in FIG. 1. The words "The United States of America" 20 are used as an example of word and phrase compression. Each recognizable word, or similar sequence of characters, is converted 22 to a code word 24 of fixed length using a dictionary technique. In the presently preferred embodiment, each code word is three bytes long. Therefore, only words of four or more characters are included within the dictionary since only such words will result in compression with the three-byte code word format. The code words 1, 2, and 3 are assigned to the words "United", "States", and "America", respectively. Compression at this level converts each recognized word within the data stream to a fixed-length word of three bytes. Compression is therefore realized for all recognized words of four or more bytes. Compression is not experienced for all words of three or fewer bytes and all larger unrecognized words. The rate of compression accordingly is partially a function of the average word length in the text being compressed.

The "recognizable" words are maintained in a dictionary which provides a one-to-one correspondence between each recognizable word (or other sequence of characters) and a unique three-byte code word. The dictionary can be implemented in virtually any form such as look-up tables or the sea-of-gates described herein.

The present invention additionally recognizes and takes advantage of the fact that compression can occur beyond simple word compression. Translation 26 (FIG. 1) illustrates the next compression step of the present invention. Specifically, the compression function 26 recognizes preselected sequences of words and/or word codes 24 as "phrases." Each time a phrase such as "The United States of America" is recognized, a "phrase code" 28 is generated and inserted into the data stream in place of the previous words and/or word codes. As with word compression, phrase compression utilizes a dictionary to recognize phrases and assign codes thereto. In the preferred embodiment, all phrase codes are also three bytes long (like word codes). Consequently, further data compression is realized whenever any combination of words and/or word codes totalling four or more bytes is recognized.

The compression techniques of the present invention go further beyond the phrase compression. The next translation step 30 recognizes combinations of phrases and/or combinations of words as "super-phrases", which may be sentences. For example, the super-phrase "The President of the United States of America" can be recognized as a combination of the word "The", the word code for "President", and the phrase code for "The United States of America." As with both word and phrase compression, super-phrase compression utilizes a dictionary to recognize words, word codes, and/or phrase codes and assign codes thereto. In the presently preferred embodiment, all super-phrase codes are also three bytes long (like word and phrase codes). Consequently, further data compression occurs whenever a combination totalling four or more bytes is recognized.

By analogy, the described compression strategy can be extended to additional levels. For example, a suitable compression step may include the encoding of "context sensitive" information. Other extensions of the compression strategy, using different dictionaries at different levels, will be appreciated from the applications subsequently described. Consequently, the present invention is adaptable to a wide variety of applications—both presently known and to be developed in the future.

Each compression level or phrase has the common feature of utilizing a dictionary to provide encoding wherever possible. The first level (i.e. translation 22) uses a dictionary of words to insert a word code whenever a character stream representative of a word within the dictionary is recognized. A second dictionary is provided for the second level encoding (i.e. translation 26) to provide a phrase code wherever a defined sequence of word codes are recognized. A dictionary is provided for the third level encoding (e.g. translation 30) to substitute a super-phrase code 32 whenever a defined sequence of phrase codes 28 (or a combination of phrase and word codes) is recognized.

Software and hardware embodiments will be described. All embodiments are suitable for "in-line" installation, for example, in a telecommunications or storage line via RS-232 or ETHERNET. The invention is therefore readily adaptable to a wide variety of applications.

B. Software Embodiment

Figure 2:
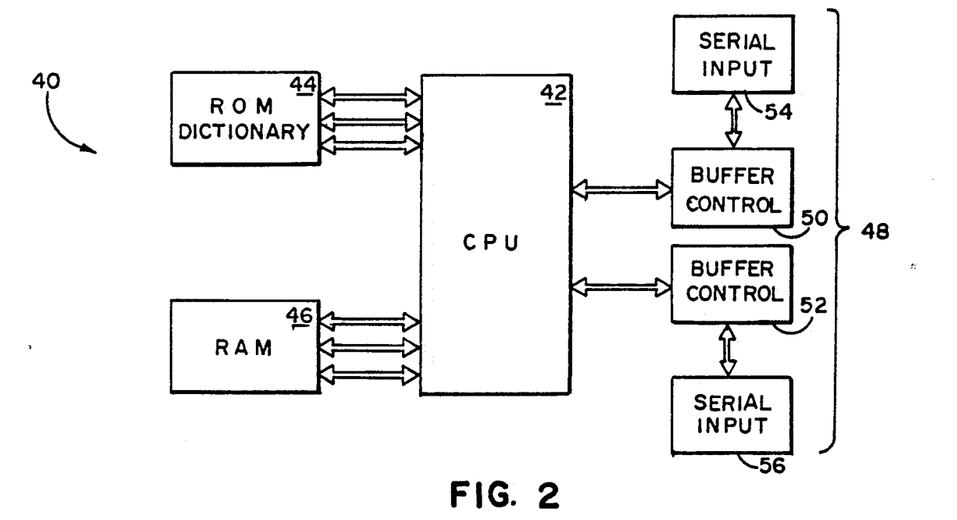
FIG. 2 is a schematic diagram showing the hardware components of a software-based implementation of the invention.

The hardware configuration of a software implementation of the present invention is illustrated in FIG. 2 and generally designated 40. The configuration includes a central processing unit (CPU) 42, a 16-megabyte read only memory (ROM) 44, a two-megabyte random access memory (RAM) 46, and appropriate input/output (I/O) hardware 48. The CPU 42 can be virtually any processing unit available, but in the preferred embodiment is an 80386-based chip. The ROM 44 provides the dictionaries utilized by the CPU and includes a plurality of recognizable words and a word code uniquely associated with each of the words, a plurality of recognizable phrases and a phrase code uniquely associated with each of the phrases, and a plurality of recognizable super-phrases and a super-phrase code uniquely associated with each of the super-phrases. The ROM may be individualized to a particular application. For example, different ROMs may be available for the legal, financial, and/or financial applications. The I/O hardware includes buffer control 50 and 52 for the input and output data streams 54 and 56, respectively. The buffer controls 50 and 52 and the RAM 46 can be of any suitable design conventional in the art.

Figure 3:
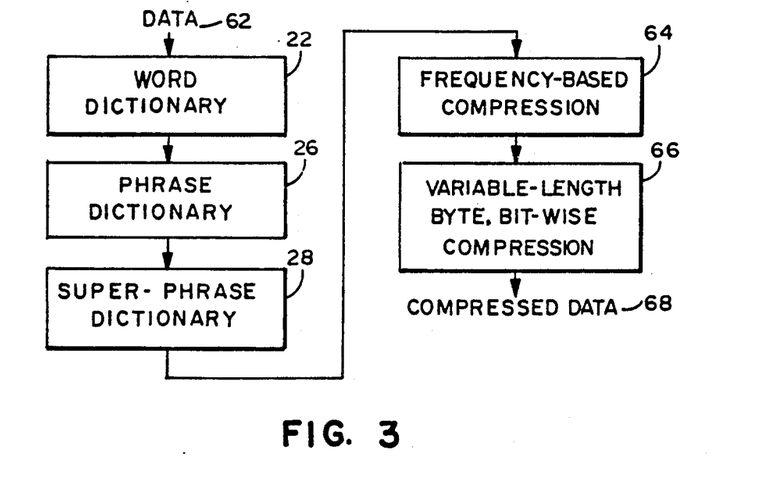
FIG. 3 is a flow chart of the software-based implementation of the present invention.
Figure 4A:
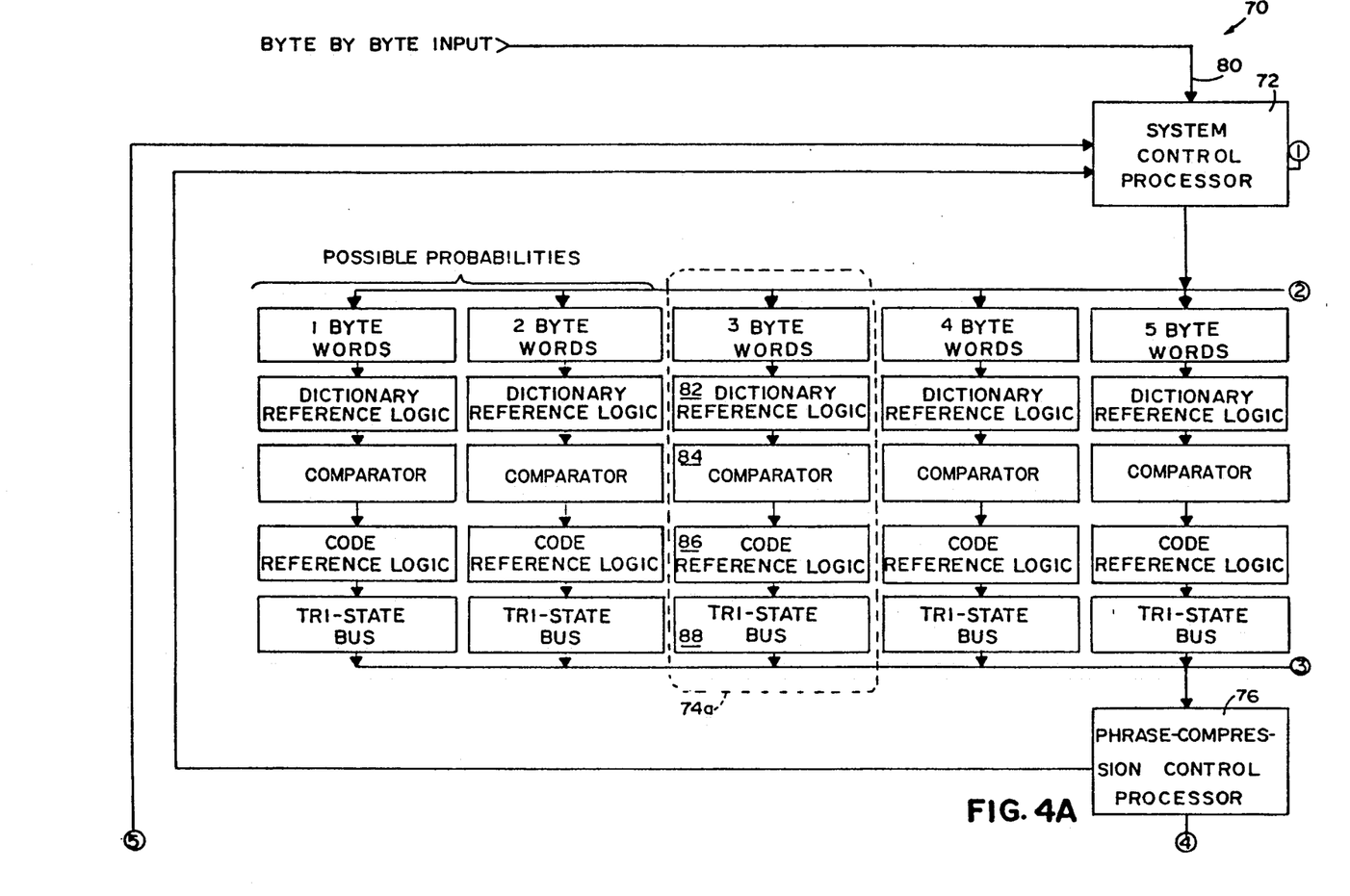
FIG. 4 is a schematic diagram of the hardware-based implementation of the present invention.
Figure 4B:
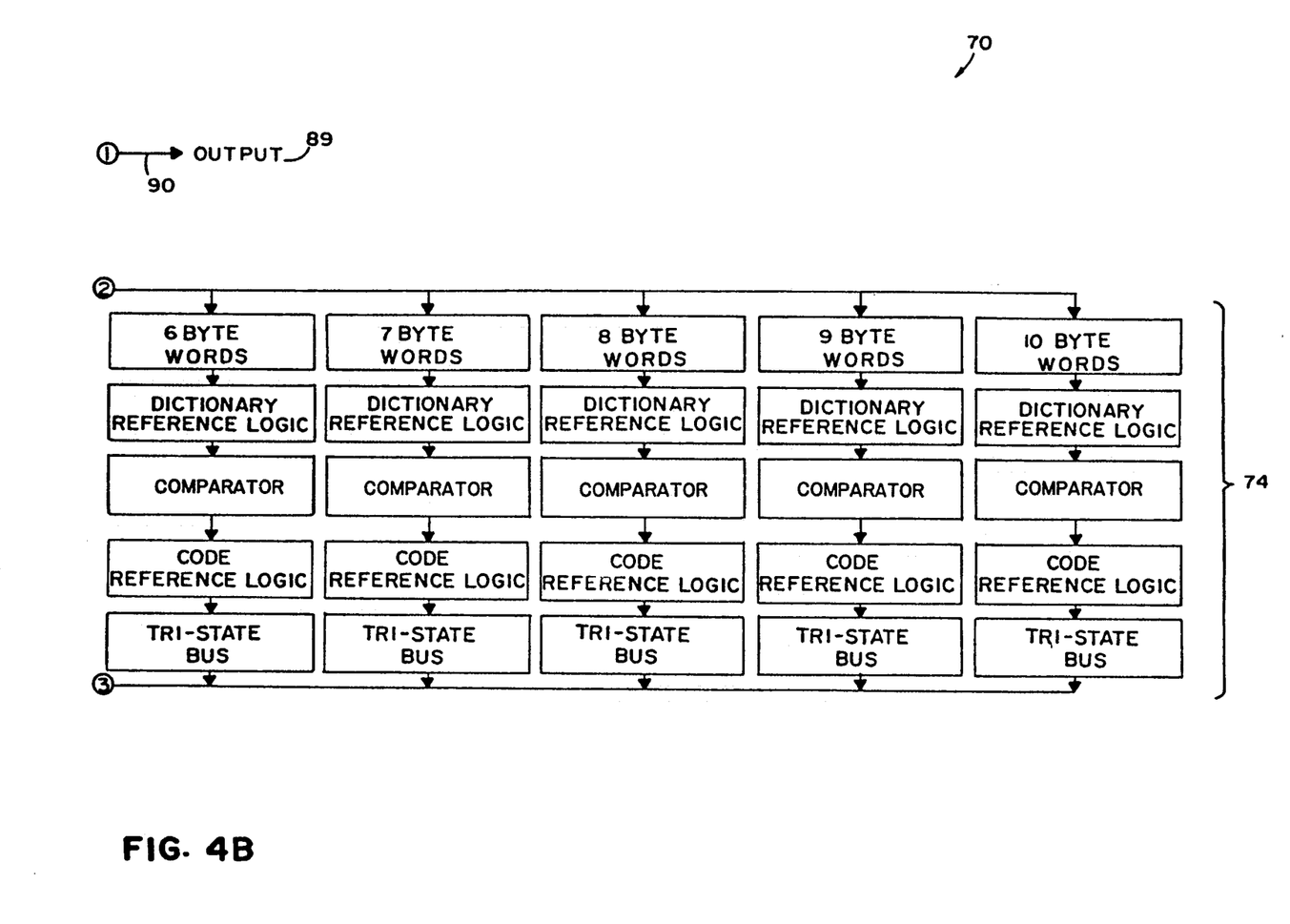
Figure 4C:
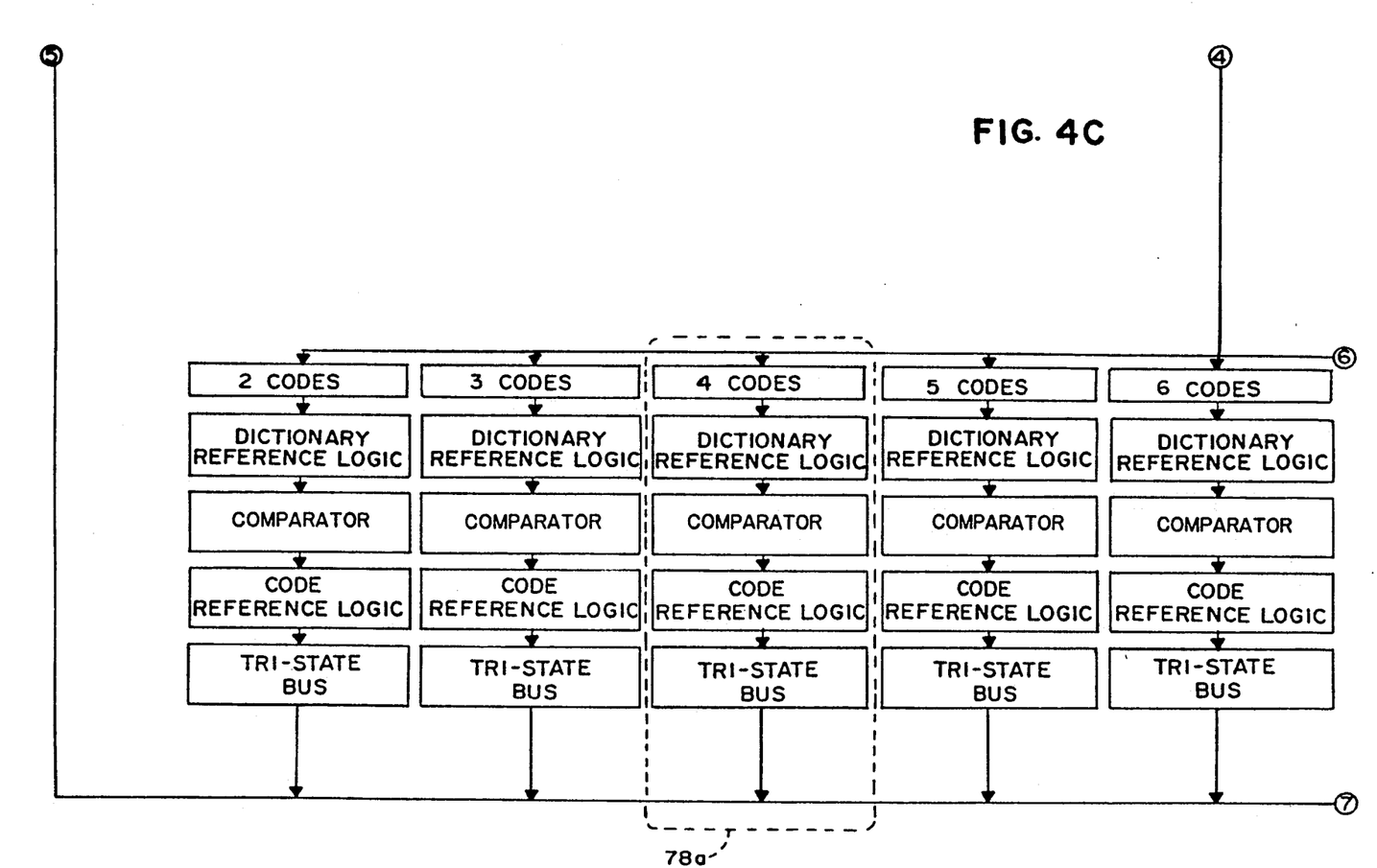
Figure 4D:
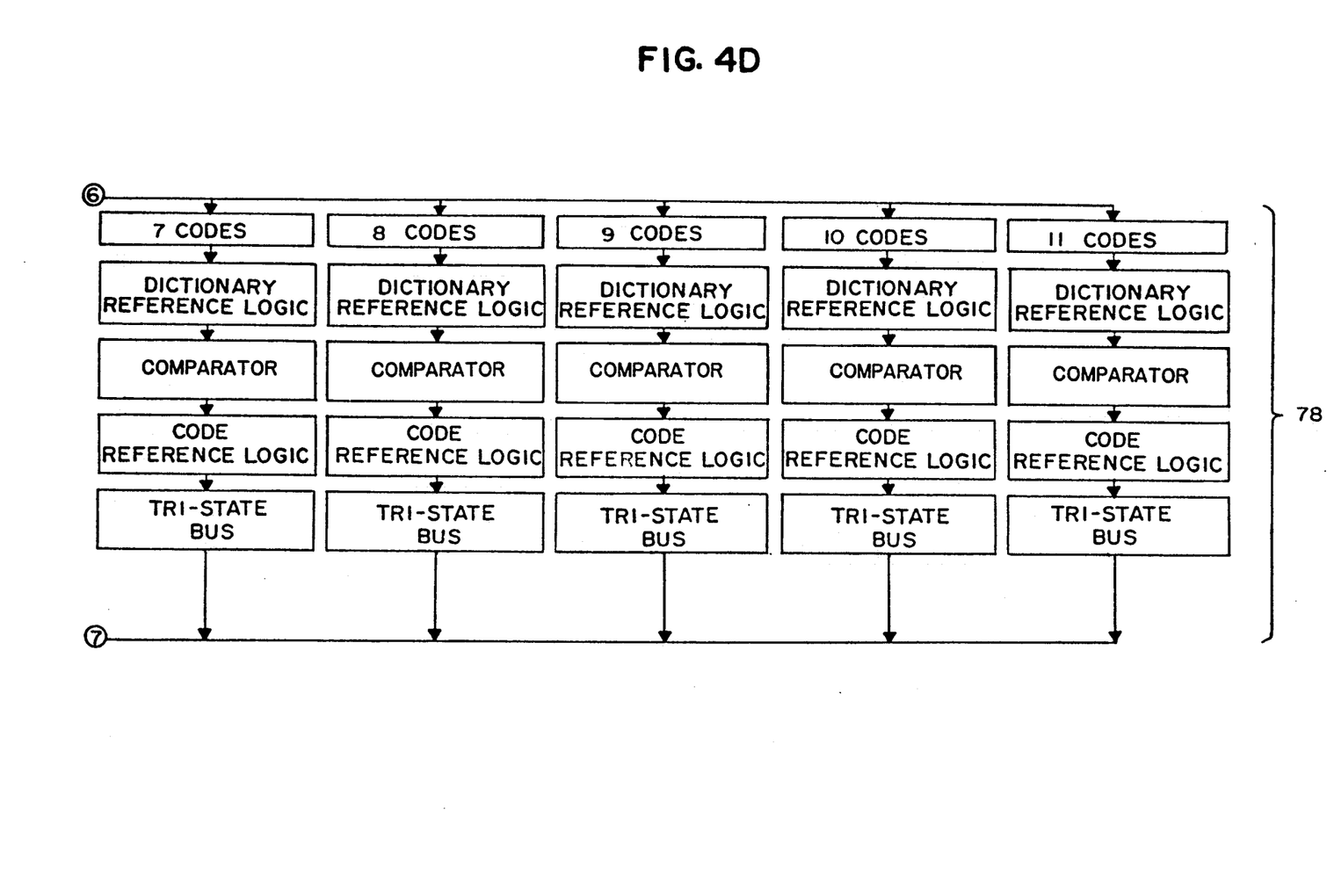

The flow chart illustrating the sequence of operation of the software implementation is illustrated in FIG. 3 and generally designated 60. The first step 22 is to conduct word encoding on the "pristine" data stream 62. The input character stream is parsed into character strings separated by blank spaces and/or punctuation marks. Each of the potential word character strings is compared with the word dictionary stored in the ROM 44. Whenever a word is "recognized" from within the dictionary, the three-byte word code is inserted into the character stream; and the recognized characters are removed.

The partially encoded character stream is then phrase compressed 26 utilizing a phrase dictionary 26 (FIG. 3) also contained within the ROM 44 (see FIG. 2). The phrase dictionary defines sequences of word codes representative of words occurring within a phrase. Whenever such a phrase is recognized, the three-byte phrase code is inserted into the data stream; and the recognized word codes comprising the phrase are removed.

A super-phrase dictionary 28 (FIG. 3) is then consulted 28 to consolidate phrases, and possibly words, into "super-phrase" codes whenever possible. As mentioned above, super-phrases may comprise full sentences or combinations of phrases short of a full sentence. As with the other dictionaries, the super-phrase dictionary is stored within the ROM 44 (see FIG. 2). Whenever a "super-phrase" sequence of phrase codes, and possibly word codes, is recognized, the super-phrase code is inserted into the data stream; and the recognized phrase code, and possibly words and word codes, are removed.

In the presently preferred software embodiment, frequency based compression 64 (FIG. 3) is performed following super-phrase compression 28. Frequency-based compression is generally well known to those skilled in the data compression art. Such compression analyzes code frequency to perform further data compression on the most frequently occurring codes within the translated data. Preferably, a separate frequency code table is prepared for each particular type (e.g. legal, financial, or insurance) of text file. Frequently used codes are assigned a one-byte code; and less frequently used codes are assigned a two-byte code. Consequently, the most frequently occurring codes are compressed at a 3-to-1 ratio by converting the three-byte code to a one-byte code. The less frequently used codes undergo 3-to-2 conversion from a three-byte code to a two-byte code.

Following the frequency-based compression 64, variable-length byte bit-wise compression 66 is performed on the encoded data stream. This compression technique is a common technique well known to those having ordinary skill in the data compression art.

The compressed or encoded data 68 retains all of the information content of the original input data 62 at a fraction of the original representation space. Unrecognized words in the input data 62 undergo only the last step of compression. Accordingly, the dictionary should be as inclusive as possible to maximize compression rates.

The compressed data 68 can be "uncompressed" using a system operating generally "backwards" to that described above. Specifically, the first step is a variable-length byte, bit-wise decompression of the compressed data 68, followed by frequency-based decompression, followed by super-phrase, phrase, and word decompression using the super-phrase, phrase, and word dictionaries, respectively.

C. Hardware Embodiment

A hardware embodiment of the present invention is illustrated in FIG. 4 and generally designated 70. Only the hardware for the word compression and phrase compression are illustrated. The hardware for the other compression steps is the logical extension thereof.

Generally speaking, the hardware implementation 70 includes a system control processor 72, word-to-code conversion circuitry 74, a phrase compression control processor 76, and word-code-to-phrase-code compression circuitry 78. The system control processor 72 receives the input character stream on bus 80 in a byte-by-byte format. The processor 72 parses the character strings into potential word segments and routes the segments to the appropriate recognition unit, such as 74a for four-byte words, for conversion.

For the present discussion, it will be assumed that a four-byte character string is being converted. The character string is first applied to a dictionary reference logic 82 to determine whether the word is "recognized" by the dictionary. The comparator 84 is used to determine whether a "match" has been found. If so, the word code is produced by the code reference logic 86 and outputted on the tristate bus 88 to the phrase compression control processor 76.

The data stream, including word codes, is then processed through a similar architecture 78 by the phrase-compression control processor 76. Specifically, the character stream is parsed into code sequences and fed to an appropriate branch, e.g. 78a, of the phrase-conversion circuitry 78 for possible phrase recognition. The phrase conversion hardware operates in a manner identical to that described above in conjunction with the word conversion hardware. To the extent that phrases are recognized, the word codes making up the phrase are removed from the data stream; and the phrase code associated with the phrase is inserted into the character stream.

Although only two levels of encoding are illustrated, the system can be extended to as many levels of encoding as desired. The compressed data stream 89 is outputted by the system control processor 72 on the bus 90 at the conclusion of the compression for subsequent telecommunication, mass storage, or the like.

Figure 5:
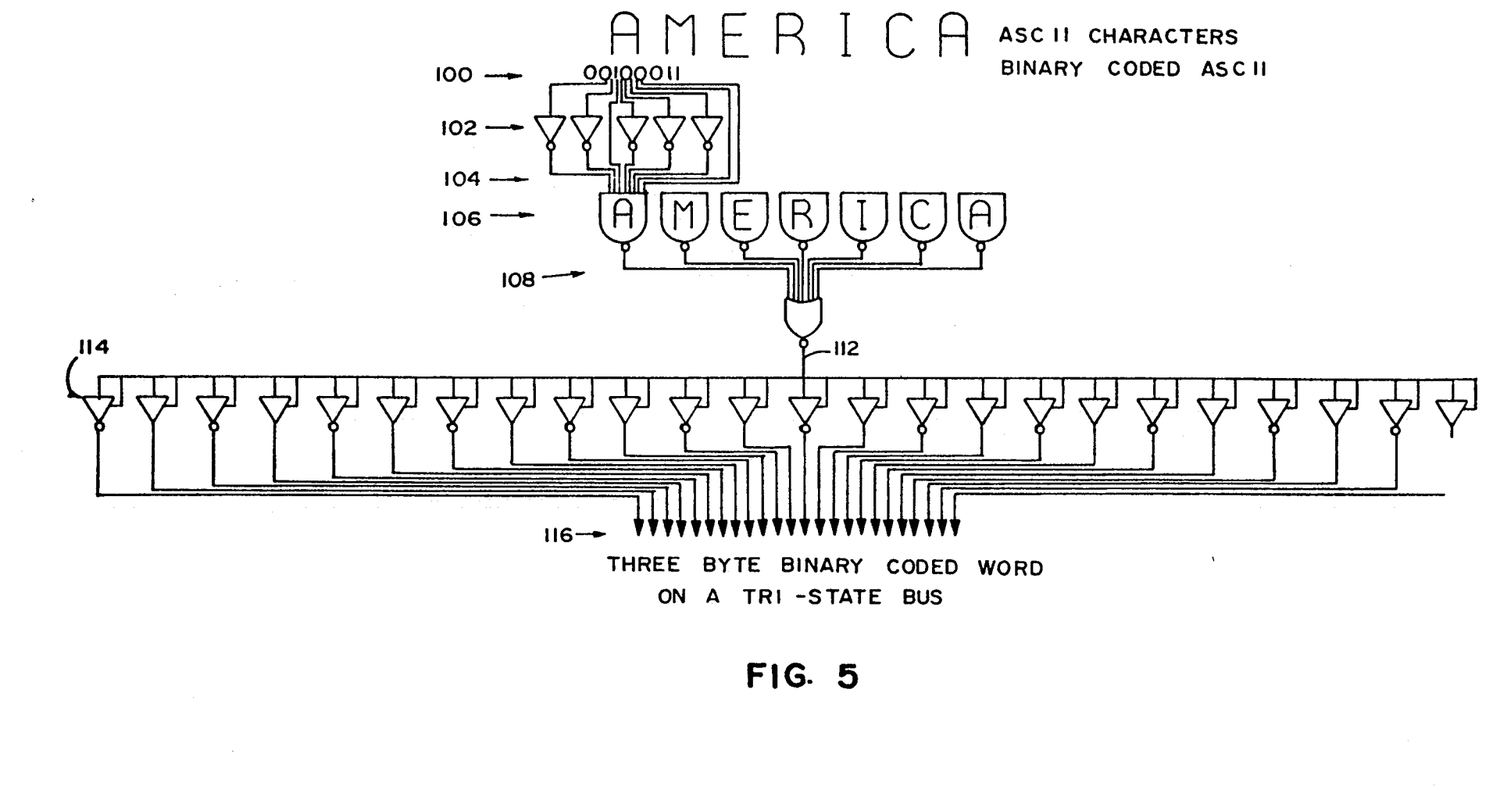
FIG. 5 is a logic diagram of one portion of the hardware-based implementation.

A "sea-of-gates" implementation of the word convertor 74a (see FIG. 4) is illustrated in FIG. 5. The portion illustrated recognizes the word "America" and outputs the appropriate three-byte code in response to such recognition. The binary coded ASCII representation 100 of the letter A is applied to the gates 102 for the first letter within the 7-character sequence for such words. All outputs on the lines 104 exiting the gates 102 are ones if the letter A is applied to the gates and is zero if any other character is applied to the gates. In similar fashion, dedicated hardware (not shown) is provided for recognition of the remaining letters within the word "America." The word recognition gates 106 comprise a series of NAND gates each of which receives the output lines 104 of the inverted or noninverted lines for a particular letter. The output of each NAND gate will therefore be zero if the desired letter is recognized and one if any other letter is applied thereto. The output lines 108 of the several NAND gates 106 are applied to a single NOR gate 110 for the word to be recognized. Therefore, the signal on output line 112 of the NOR gate 110 is one if the word "America" is recognized and zero if any other word is applied thereto. In similar fashion, one NOR gate 110 is provided for each word recognizable by the dictionary. The signal on line 112 is then applied to the inverters 114 which output a three-byte coded word on the lines 116 of the code uniquely associated with the word "America" when that word has been recognized. Otherwise, all outputs on lines 116 are low.

The described hardware implementation can be realized using "sea-of-gates" technology which is generally well known to those having ordinary skill in the hardware art. Such technology provides approximately four million gates per chip in very large scale integration (VLSI). The dictionary portion for strings of a preselected number of characters or codes can be placed on a single chip. For example, the dictionary for all four-character words would be on one chip, while the dictionary for all five-byte words would be on a second chip, and so forth.

Two advantages of the "sea-of-gates" embodiment are readily apparent. First, comparison with all dictionary words occurs simultaneously. Second, comparison occurs within a single clock pulse for the digital device providing the sea of gates. Both features enable previously unparalleled speeds in the encoding process.

Again, once the data has been compressed, subsequent telecommunications and/or storage occur as is conventional in the art. The data can be "uncompressed" using a system "backwards" to that described. The data is therefore readily compressed and decompressed as desired.

II. Applications

The described software and hardware implementations of the fundamental invention can be utilized in effecting a wide variety of applications. Two such applications—namely language translation and voice recognition—are described in this application. Additional applications will be readily apparent to those having ordinary skill in the art.

A. Language Translation

Full foreign language translation including accurate idiomatic translation is possible using the present invention. Such realization is possible because the translation goes beyond simple word-for-word translation to provide phrase or idiomatic information also.

In language translation, at least the first two compression techniques described above are used. Specifically, word compression is first performed to convert all recognizable words to numeric codes. Then, phrase compression occurs to convert all phrases, including idiomatic phrases, to numeric codes. Such idiomatic information enables a rapid and easy translation between idioms in different foreign languages.

The importance of idiomatic information is illustrated by way of example in conjunction with the phrase "burned the midnight oil". In a literal translation from English to any other language, the sentence "He burned the midnight oil" might lead one to believe that the referenced individual is a pyromaniac. However, if the translator recognizes the phrase "burned the midnight oil" as an idiomatic phrase and provides a single numeric code for the phrase, the translation process can be completed by decompressing the data using an idiomatic phrase entirely appropriate in the new language which may make no reference to either burning or oil. In other words, a full and accurate idiomatic translation is enabled where a word-for-word translation from one language to the other or vice versa would simply not work.

In summary, the steps of a foreign translation utilizing the basic technique of the present invention are (1) convert all recognizable words to numeric codes; (2) convert all recognizable phrases including at least some idiomatic phrases to numeric codes; (3) convert the numeric codes, some of which are representative of idiomatic information, to appropriate word codes representative of a phrase in the new language; and (4) decompress the word codes into characters strings in the new language.

B. Voice-Recognition Control System

Figure 6:
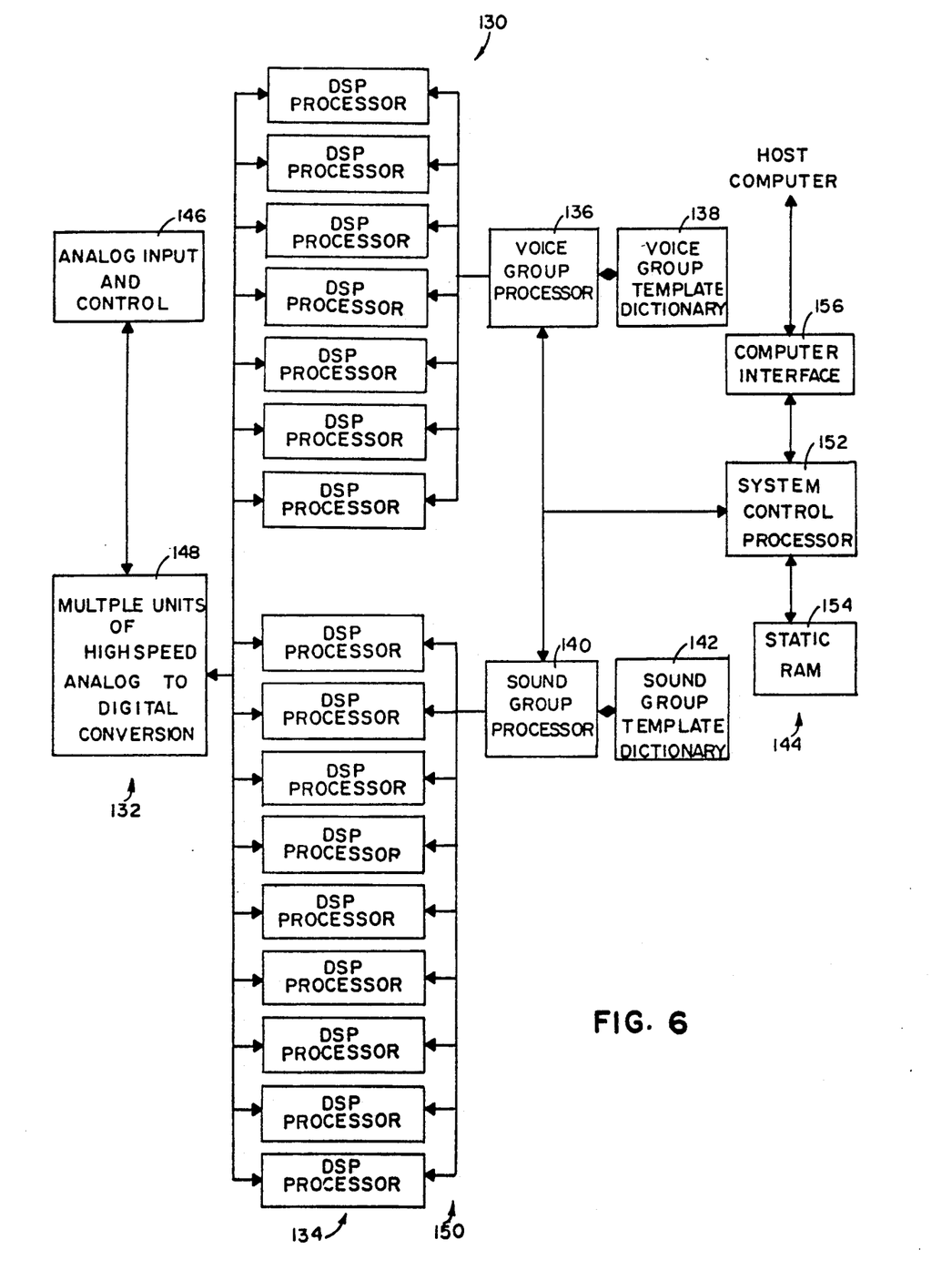
FIG. 6 is a schematic diagram of a voice-recognition control system utilizing the present invention.

A voice-recognition control system constructed using the compression techniques of the present invention is illustrated in FIG. 6 and generally designated 130. Generally speaking, the system includes a transducer section 132, a digital signal processor (DSP) section 134, a voice group processor 136 and associated dictionary 138, a sound group processor 140 and associated dictionary 142, and a control section 144.

The transducer section 132 includes analog input and control circuitry 146 including a microphone (not shown). This section also includes multiple units of high speed analog-to-digital converters 148 for converting the analog sound information into digitized signals.

A plurality of digital signal processors are provided within the DSP section 134. Preferably, each processor is responsive to a unique frequency range to output words on busses 150 representative of the audio signal amplitude within the associated frequency range.

The voice group processor 136 and sound group processor 140 operate generally similarly with the distinction that the voice group processor need analyze only a subset of the frequencies analyzed by the sound group processor. The voice group processor 136 samples the digital words on the bus 150 and then determines using the dictionary 138 whether particular combinations of these words, indicative of individual sounds, are "recognizable". For example, the word pattern corresponding to desired voice samples ma be stored within the dictionary 138 so that particular individual voices will be recognized. In similar fashion, the sound group processor 140 can be programmed to recognize desired sounds.

The control circuitry includes a control processor 152, static RAM 154, and a host computer interface 156. The system control processor interacts with the voice group processor 136 and the sound group processor 140 to perform certain functions in response to the recognition of certain voices. For example, access to the host computer connected to the computer interface 56 may be enabled only when an appropriate individuals voice is detected. The control functions possible in response to individual noises are limited only by the imagination.

III. Conclusion

In conclusion, the present invention provides data compression at previously unavailable rates by progressing far beyond the traditional word encoding techniques. Phrase, super-phrase, and even context-sensitive compression is available using dictionary-based techniques. Although exemplary applications have been illustrated and described, the potential applications are virtually limitless.

The above descriptions are those of preferred embodiments of the invention. Various changes and alterations can be made without departing from the spirit and broader aspects of the invention as set forth in the appended claims, which are to be interpreted in accordance with the principles of patent law including the doctrine of equivalents.

The embodiments of the invention in which an exclusive property or privilege is claimed are defined as follows:

1. A method of compressing input data into compressed data, the input data being coded character by character, said method comprising:
   providing a word dictionary of recognizable character strings and a word code for each such string;
   providing a phrase dictionary of recognizable word code strings and a phrase code for each such string;
   comparing the input data with the word dictionary and substituting for each recognizable character string the word code associated with such string; and
   comparing the input data as modified by said first comparing step with the phrase dictionary and substituting for each recognizable string of word codes the phrase code associated with such string.

2. A method as defined in claim 1 further comprising:
   providing a super-phrase dictionary of recognizable strings of phrase codes and a super-phrase code for each such string; and
   comparing the input data as modified by said second comparing step with the super-phrase dictionary and substituting for each recognizable string of phrase codes the super-phrase code associated with such string.

3. A method as defined in claim 1 wherein the recognizable character strings comprise language words.

4. A method as defined in claim 3 wherein the recognizable strings of word codes are representative of language idioms.

5. A method as defined in claim 1 wherein each of said comparing steps occurs within a digital device capable of comparison with all recognizable strings within one clock pulse for the device.

6. A method as defined in claim 1 wherein each of said comparing steps occurs within a digital device capable of comparison with all recognizable strings simultaneously.

7. A method of compressing input data into compressed data, the input data being coded character by character, said method comprising:
   comparing the input data with preselected strings of characters;
   substituting into the input data a preselected word code for each detected preselected character string, each word code being unique to one of the preselected character strings, said substituting step producing modified input data;

comparing the modified input data with preselected strings of word codes; and substituting into the input data a preselected phrase code for each detected preselected string of word codes, each phrase code being unique to one of the preselected strings of word codes.

8. A method as defined in claim 7 wherein each of said comparing steps occurs within a digital device capable of comparison with all of the recognizable strings within said step simultaneously.

9. A method as defined in claim 7 wherein each of said comparing steps occurs within a digital device capable of comparison with all of the recognizable strings within said step within a single clock pulse for the device.

10. A method as defined in claim 7 wherein:
the strings of characters represent words; and
the strings of word codes represent phrases.

11. An improved data compression circuit for compressing input data coded character by character, said circuit including dictionary means for recognizing preselected character strings and identifying a preselected code word therefore, said improvement comprising said dictionary means comprising a digital device including means for making said recognition and said identification within a single clock pulse for said digital device.

12. A data compression circuit as defined in claim 11 wherein said digital device includes:
a plurality of comparison circuits each associated with one of the character strings; and
circuitry enabling the input data to be simultaneously processed in all of the comparison circuits.

13. A method of compressing input data coded character by character comprising:
identifying preselected character strings within the input data;
providing a word code for each identified character string, each word code being unique to one of the preselected character strings;
identifying preselected strings of word codes within the modified input data;
providing a phrase code for each identified string of word codes, each phrase code being unique to one of the preselected strings of word codes;
identifying preselected strings of phrase codes within the twice modified input data;
providing a super-phrase code for each identified string of phrase codes, each super-phrase code being unique to one of the preselected strings of phrase codes;
performing frequency-based compression on the thrice-modified input data to produce frequency-based compressed data; and
performing a variable-length byte, bit-wise compression on the frequency-based compressed data to produce fully compressed data.

14. A method as defined in claim 13 wherein each word code string is a representative of a language idiom.

15. An apparatus for compressing input data into compressed data, the input data being coded character by character, said apparatus comprising:
word dictionary means for providing a word dictionary of recognizable character strings and a word code for each such string;

phrase dictionary means for providing a phrase dictionary of recognizable strings of word codes and a phrase code for each such string;

word comparison means for comparing the input data with the word dictionary and substituting for each recognizable character string the word code associated with such string; and phase comparison means for comparing the input data as modified by said first comparing step with the phrase dictionary and substituting for each recognizable string of word codes the phrase code associated with such string.

16. An apparatus as defined in claim 15 further comprising:
super-phrase dictionary means for providing a super-phrase dictionary of recognizable strings of phrase codes and a super-phrase code for each such string; and super-phrase comparison means for comparing the input data as modified by said second comparing step with the super-phrase dictionary and substituting for each recognizable string of phrase codes the super-phrase code associated with such string.

17. An apparatus as defined in claim 15 wherein the recognizable character strings comprise language words.

18. An apparatus as defined in claim 17 wherein the recognizable word-code strings are representative of language idioms.

19. An apparatus as defined in claim 15 wherein each of said comparison means includes a digital device capable of comparison with all recognizable strings within one clock pulse for the device.

20. An apparatus as defined in claim 15 wherein each of said comparison means includes a digital device capable of comparison with all recognizable strings simultaneously.

21. An apparatus for compressing input data into compressed data, the input data being coded character by character, said apparatus comprising:
first comparison means for comparing the input data with preselected strings of characters;
first substituting means for substituting into the input data a preselected word code for each detected preselected character string, the word code being unique to one of the preselected character strings;
second comparison means for comparing the modified input data with preselected strings of words codes; and
second substituting means for substituting into the input data a preselected phrase code for each detected preselected string of word codes, the phrase code being unique to one of the preselected strings of word codes.

22. An apparatus as defined in claim 21 wherein each of said comparison means includes a digital device capable of comparing the input data with all of the recognizable strings simultaneously.

23. An apparatus as defined in claim 21 wherein each of said comparison means includes a digital device capable of comparing the input data with all of the recognizable strings within a single clock pulse for the device.

24. An apparatus as defined in claim 21 wherein:
the strings of characters represent words; and
the strings of word codes represent phrases.

25. An apparatus for compressing input data coded character by character comprising:

first identifying means for identifying preselected character strings within the input data;

first encoding means for providing a word code for each identified character string, each word code being unique to one of the preselected character strings;

second identifying means for identifying preselected strings of word codes within the modified input data;

second encoding means for providing a phrase code for each identified string of word codes, each phrase code being unique to one of the preselected strings of word codes;

third identifying means for identifying preselected strings of phrase codes within the twice modified input data;

third encoding means for providing a super-phrase code for each identified string of phrase codes, each super-phrase code being unique to one of the preselected phrase strings;

fourth encoding means for performing frequency-based compression on the thrice-modified input data to produce frequency-based compressed data; and fifth encoding means for performing a variable-length byte, bit-wise compression on the frequency-based compressed data to produce fully compressed data.

26. An apparatus as defined in claim 25 wherein each word-code string is representative of a language idiom.

* * * * *